(12) United States Patent
Rubenstein et al.

(10) Patent No.: US 6,807,057 B2
(45) Date of Patent: Oct. 19, 2004

(54) APPARATUS AND METHOD FOR COOLING AN ELECTRONIC DEVICE

(75) Inventors: Brandon Rubenstein, Loveland, CO (US); Andrew D Delano, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 54 days.

(21) Appl. No.: 10/348,875

(22) Filed: Jan. 22, 2003

(65) Prior Publication Data

US 2004/0141289 A1 Jul. 22, 2004

(51) Int. Cl.[7] .............................................. H05K 7/20
(52) U.S. Cl. ..................... 361/697; 361/687; 361/695; 165/121; 454/184
(58) Field of Search .................. 361/686, 687, 361/692, 695, 727, 690; 165/104.32, 104.33, 104.34, 121, 185, 80.2, 80.3; 257/713–726; 454/184

(56) References Cited

U.S. PATENT DOCUMENTS

| | | | | |
|---|---|---|---|---|
| 3,956,673 A | * | 5/1976 | Seid | 361/690 |
| 5,150,278 A | * | 9/1992 | Lynes et al. | 361/690 |
| 6,043,980 A | * | 3/2000 | Katsui | 361/695 |
| 6,222,729 B1 | * | 4/2001 | Yoshikawa | 361/695 |
| 6,382,306 B1 | * | 5/2002 | Hsu | 165/80.3 |
| 6,459,579 B1 | * | 10/2002 | Farmer et al. | 361/695 |
| 6,498,395 B2 | * | 12/2002 | Baek et al. | 257/722 |

* cited by examiner

*Primary Examiner*—Michael Datskovsky
(74) *Attorney, Agent, or Firm*—Thomas M. Croft

(57) ABSTRACT

An apparatus for cooling an electronic device includes at least one angled flow control vane to divert a first airflow such that it blends with a second airflow that, prior to diversion of the first airflow, is substantially orthogonal to the first airflow. The efficient blending of the two airflows results in improved cooling of the electronic device.

20 Claims, 4 Drawing Sheets

APPARATUS AND METHOD FOR COOLING AN ELECTRONIC DEVICE

FIELD OF THE INVENTION

The present invention relates generally to electronic devices such as integrated circuits and more specifically to apparatuses for cooling electronic devices.

BACKGROUND OF THE INVENTION

A common challenge with electronic systems is cooling electronic devices such as integrated circuits so they do not exceed their allowable operating temperature. The challenge is especially acute with high-power electronic devices that necessarily dissipate a lot of heat. For example, a multi-socketed server may contain, within an enclosure, multiple circuit boards, each of which includes multiple high-speed microprocessors. In such a system, the components on a single circuit board may dissipate hundreds of watts. Often, a heat sink is used to aid heat dissipation from the high-power electronic devices in such a system. The heat sink may have its own local fan that draws air into the heat sink, the air subsequently exiting through openings in the heat sink. The enclosure may also have mounted in it one or more fans to create a system airflow across the interior of the enclosure, the fans drawing fresh air into the enclosure and expelling hot air from the enclosure.

A situation sometimes arises in which an outlet of a heat sink is near a wall of the enclosure and the exhaust airflow exiting the heat sink through that outlet is roughly orthogonal to the system airflow. The two airflows, being orthogonal, interfere somewhat with each other when they combine, decreasing the efficiency with which the associated electronic device is cooled.

It is thus apparent that there is a need in the art for an improved apparatus and method for cooling electronic devices in the situation described.

SUMMARY OF THE INVENTION

An apparatus and associated method for cooling an electronic device are provided. An electronic system incorporating the cooling apparatus and method is also provided.

Other aspects and advantages of the present invention will become apparent from the following detailed description, taken in conjunction with the accompanying drawings, illustrating by way of example the principles of the invention.

DETAILED DESCRIPTION OF THE INVENTION

Cooling efficiency may be improved by more efficiently blending the airflow exiting the heat sink with the system airflow.

Figure 1:
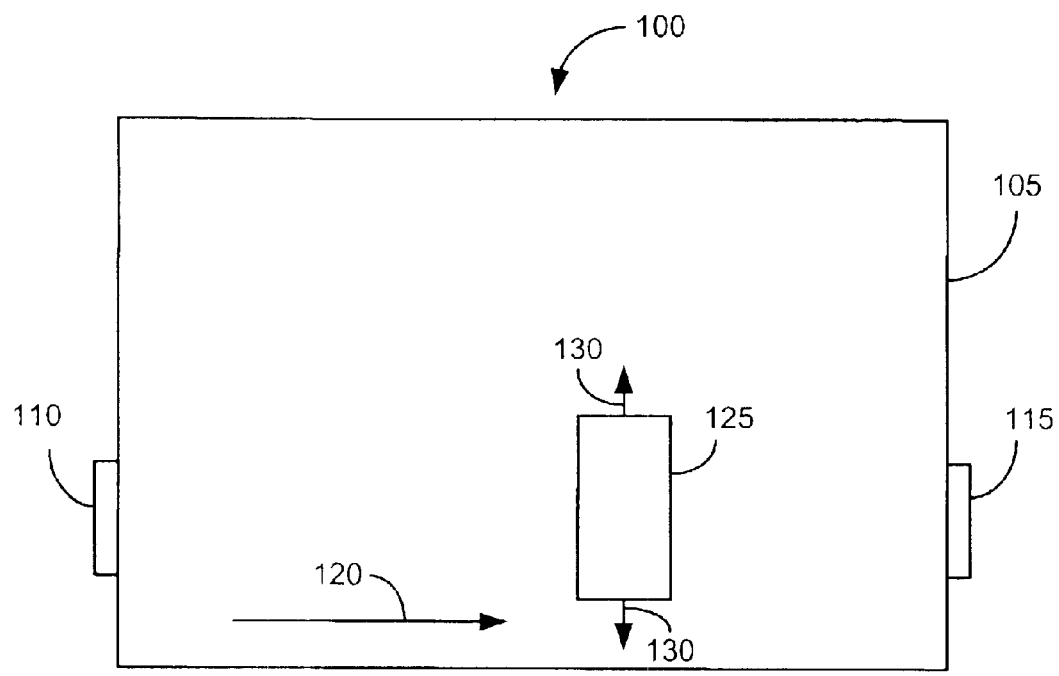
FIG. 1 is a simplified top view of a prior-art electronic system including a heat sink.

FIG. 1, a simplified top view of a prior-art electronic system 100, illustrates the problem described in the Background of the Invention. In this prior-art configuration, an electronic system 100 comprises enclosure 105, in which fans 110 and 115 have been mounted. Fans 110 and 115 cooperate (e.g., by one fan pushing and the other pulling in the same direction) to generate system airflow 120 across the interior of enclosure 105. Heat sink 125 has an associated airflow 130 that exits at both open ends of heat sink 125. In this example, one end of heat sink 125 is near (e.g., a few inches from) a wall of enclosure 105. Airflow 130 is approximately orthogonal to system airflow 120, resulting in the two airflows interfering with each other.

Figure 2:
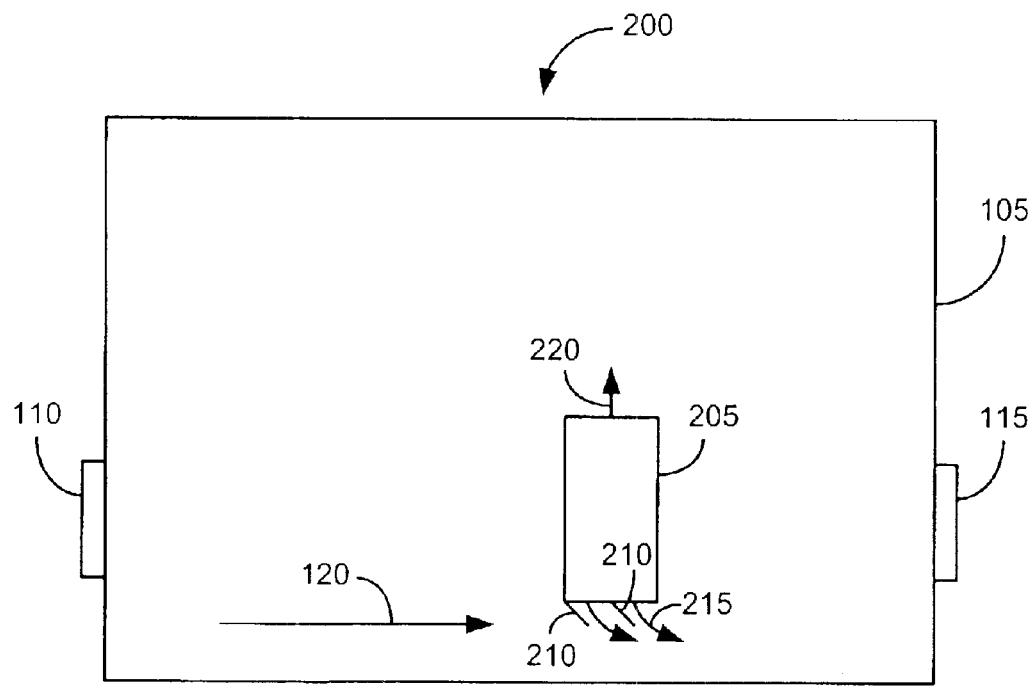
FIG. 2 is a simplified top view of an electronic system including a heat sink in accordance with an illustrative embodiment of the invention.

FIG. 2 is a simplified top view of an electronic system 200 including a heat sink in accordance with an illustrative embodiment of the invention. In FIG. 2, an end of heat sink 205 is also near a flow obstruction (e.g., a wall of enclosure 105). However, angled flow control vanes 210 situated at the end of heat sink 205 divert heat sink exhaust airflow 215 such that it blends more efficiently with system airflow 120. The result is a decrease in temperature of the electronic device cooled by heat sink 205. One example of an electronic system 200 to which the invention may be advantageously applied is a multi-socketed server. In such a system, the invention may be used, for example, to cool electronic devices in dual-processor circuit boards. The techniques of the invention, however, are applicable to a wide variety of electronic Systems other than servers. Examples include, but are not limited to, desktop personal computers, television sets, control systems, and audio systems.

Angled flow control vanes 210 may be integral with heat sink 205 or part of a separate but adjacent structure. Generally, a small number of angled flow control vanes 210 (e.g., two or three) is preferable to maximize the gain in efficiency, but more may be used. Addition of such angled flow control vanes 210 has been shown, through computational simulations of the dual-processor circuit board environment mentioned above, to improve heat sink efficiency by 9 percent over cooling apparatuses such as that in FIG. 1 in which angled flow control vanes 210 are absent.

Figure 3:
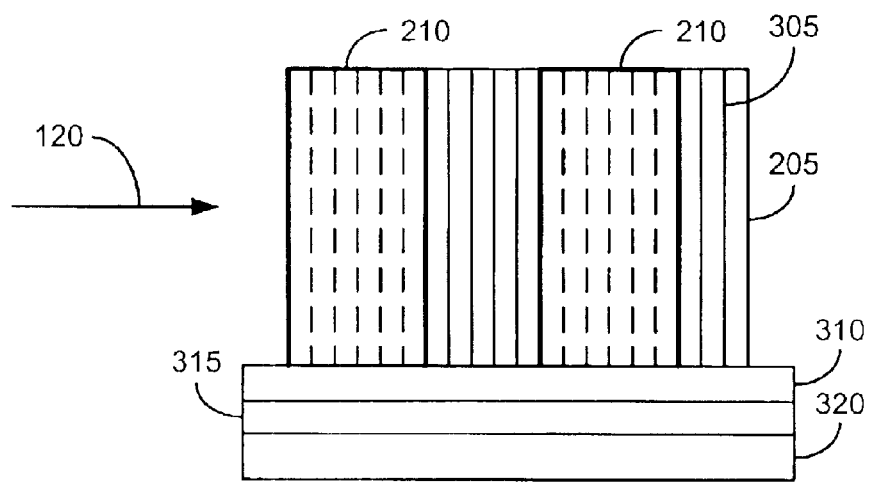
FIG. 3 is an end view of a heat sink in accordance with an illustrative embodiment of the invention.

FIG. 3 is an end view of heat sink 205 in accordance with an illustrative embodiment of the invention. Though other types of heat sinks 205 may be used, the type shown in FIG. 3 sufficiently illustrates the principles of the invention. Heat sink 205 may comprise a set of substantially parallel plates 305 that are typically made of a heat-conductive metal such as copper. Plates 305 may be soldered to a first heat spreader surface 310, which is typically made of aluminum. First heat spreader surface 310 may in turn be in contact (and thermal communication) with a second heat spreader surface 315 that is in thermal communication with a printed circuit board (PCB) 320 having one or more electronic devices. Angled flow control vanes 210 are shown in heavy outline in FIG. 3, the dashed lines in FIG. 3 indicating plates 305 that lie behind angled flow control vanes 210. Although angled flow control vanes 210 may be part of a structure separate from heat sink 205, it is preferable for each angled flow control vane 210 to be integral with a plate 305. Plates 305 are often realized as a sheet of metal that is folded repeatedly. Therefore, during manufacturing of heat sink 205, angled flow control vanes 210 may be part of the metal sheet that is folded to create plates 305.

Figure 4:
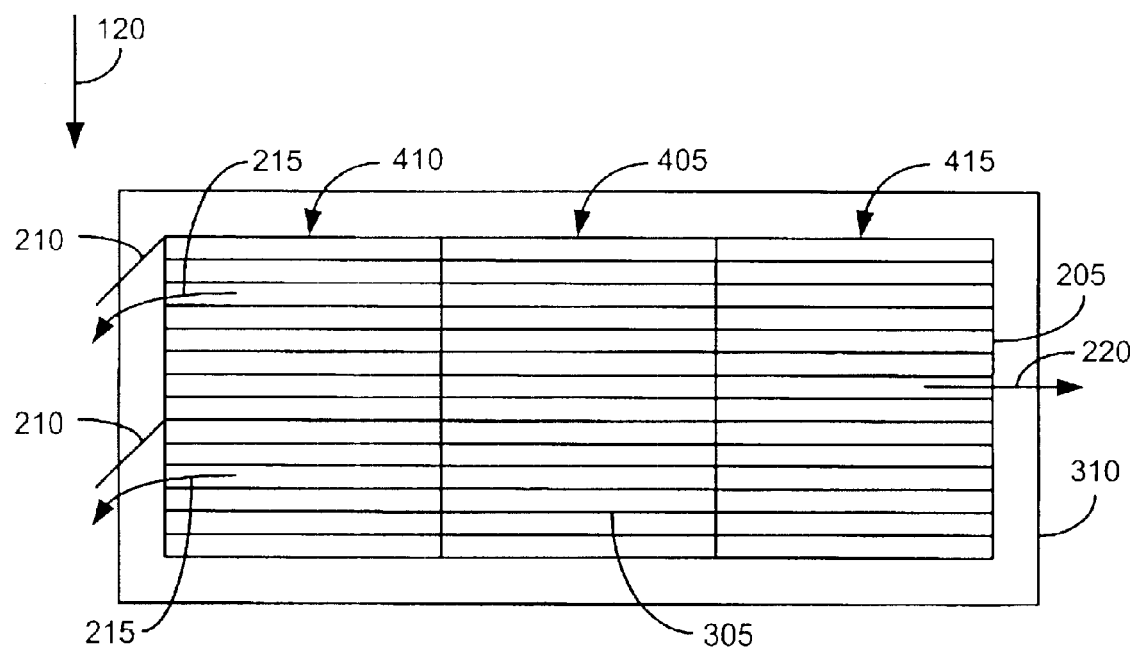
FIG. 4 is a top view of a heat sink in accordance with an illustrative embodiment of the invention.

FIG. 4 is a top view of heat sink 205 shown in FIG. 3 in accordance with an illustrative embodiment of the invention. Plates 305 may have an open center section 405 along the edges of the plates 305 opposite first heat spreader surface 310. Center section 405 allows air to be directed into heat sink 205 from outside heat sink 205. Heat sink 205 may also have two end sections 410 and 415 that are closed along the edges of the plates 305 opposite first heat spreader surface 310. This causes airflows 215 and 220 originating from center section 405 to flow along the interior of heat sink 205 and to exit at both open ends of heat sink 205, as illustrated. In FIG. 4, angled flow control vanes 210 are shown diverting airflow 215 only. In a different embodiment, both ends of heat sink 205 may be near a flow obstruction (e.g., electronic system 200 is housed in a smaller enclosure 105). In such a case, similar angled flow control vanes 210 may be included at the other end of heat sink 205 to divert airflow 220.

Figure 5:
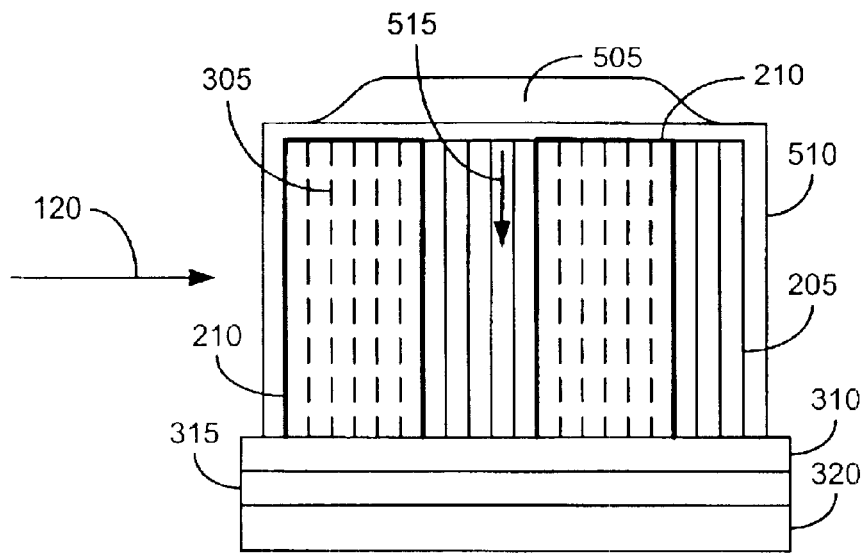
FIG. 5 is an end view of a heat sink across which a fan has been mounted in accordance with an illustrative embodiment of the invention.

FIG. 5 is an end view of heat sink 205 shown in FIGS. 3 and 4 across which a fan 505 has been mounted in accordance with an illustrative embodiment of the invention. Fan 505 may be mounted to a framework 510 that straddles heat sink 205. Fan 505 draws air from outside heat sink 205 and directs it into center section 405 as explained in connection with FIG. 4. Airflow 515 established by fan 505 results in airflows 215 and 220, which exit heat sink 205 in a direction approximately orthogonal to airflow 515.

Figure 6:
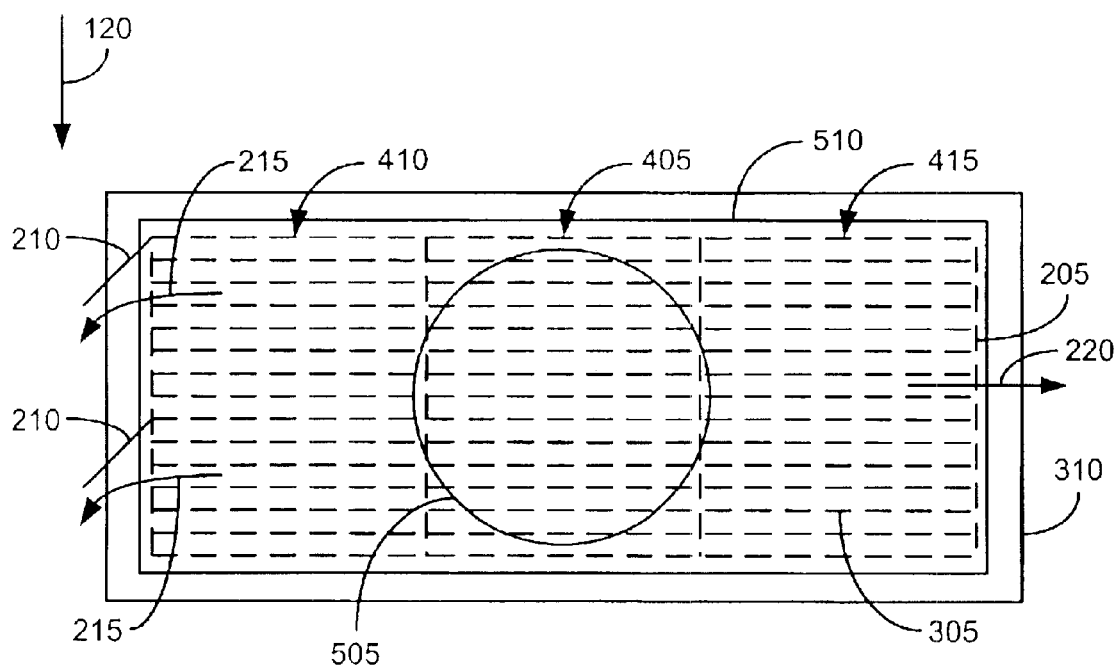
FIG. 6 is a top view of a heat sink across which a fan has been mounted in accordance with an illustrative embodiment of the invention.

FIG. 6 is a top view of heat sink 205 shown in FIG. 5 with fan 505 mounted across heat sink 205.

Figure 7:
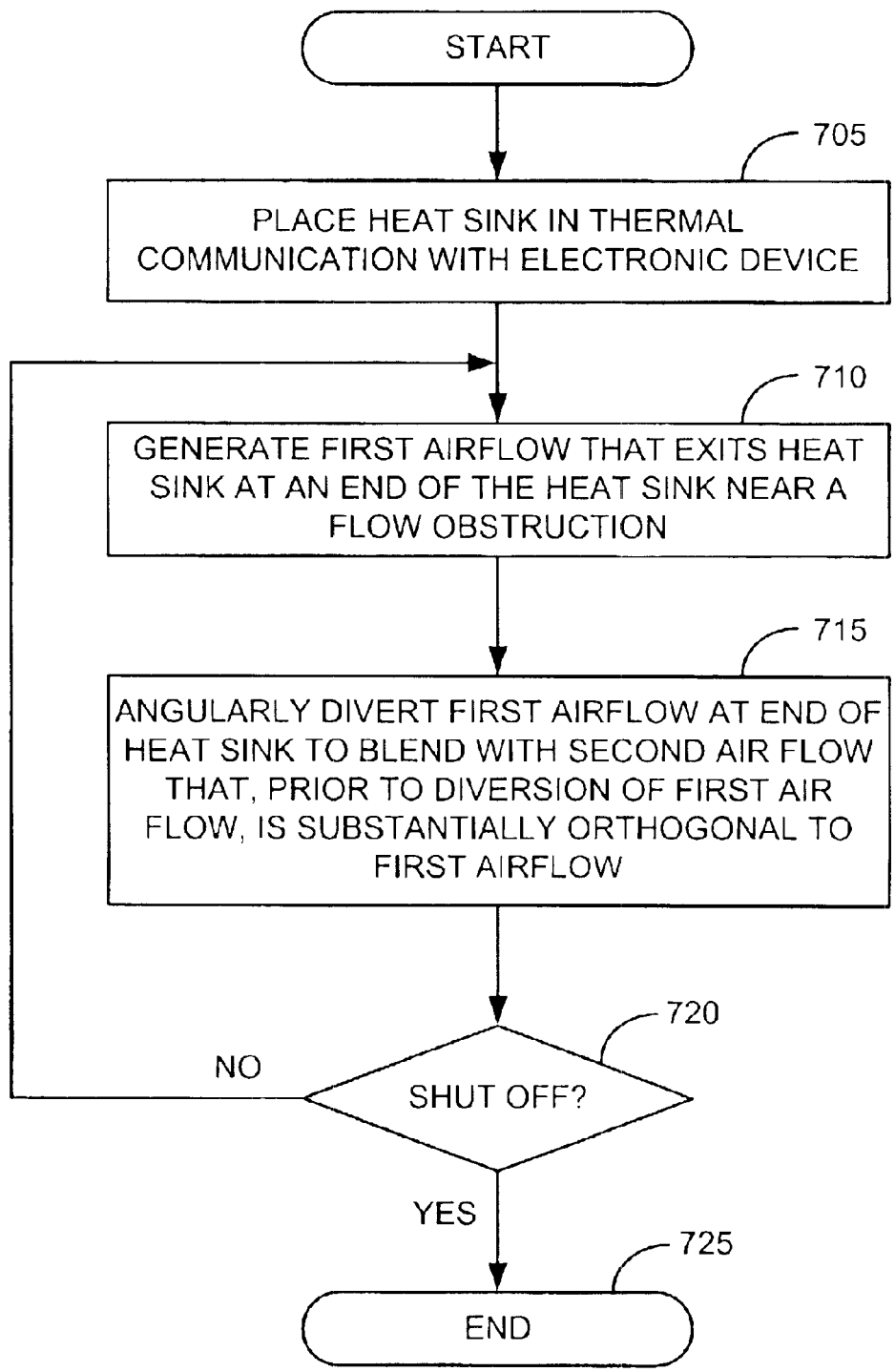
FIG. 7 is a flowchart of a method for cooling an electronic device in accordance with an illustrative embodiment of the invention.

FIG. 7 is a flowchart of a method for cooling an electronic device in accordance with an illustrative embodiment of the invention. During manufacture of an electronic system 200, heat sink 205 may, at 705, be placed in thermal communication with one or more electronic devices in electronic system 200. At 710, a first airflow is generated (e.g., using fan 505) that exits heat sink 205 at its open ends, as explained above. At least one end of heat sink 205 is near a flow obstruction such as a wall of enclosure 105. At 715, first airflow 215 is angularly diverted to blend with a second airflow (system airflow 120). Prior to diversion at 715, first airflow 215 is approximately orthogonal to system airflow 120. If electronic system 200 is shut down at 720, the process terminates at 725 and may be re-entered subsequently at 710, so long as heat sink 205 remains in place. Otherwise, steps 710, 715, and 720 are repeated for as long as electronic system 200 is in operation.

The foregoing description of the present invention has been presented for the purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An apparatus for cooling an electronic device, comprising:
   a heat sink in thermal communication with the electronic device; and
   at least one angled flow control vane at an end of the heat sink to divert a first airflow exiting the end such that the first airflow blends with a second airflow, the first airflow being, prior to its diversion, substantially orthogonal to the second airflow, the end being near an airflow obstruction.

2. The apparatus of claim 1, wherein the heat sink comprises:
   a heat spreader surface in thermal communication with the electronic device; and
   a set of substantially parallel plates extending from and in thermal communication with the heat spreader surface.

3. The apparatus of claim 2, wherein each of the at least one angled flow control vanes is integral with one of the substantially parallel plates.

4. The apparatus of claim 2, wherein the set of substantially parallel plates is open in a center section along its edges opposite the heat spreader surface and closed in each of two end sections along its edges opposite the heat spreader surface and the apparatus further comprises:
   a fan mounted across the center section to direct air into the center section, thereby generating the first airflow.

5. The apparatus of claim 1, wherein the airflow obstruction comprises a wall of an enclosure of an electronic system.

6. The apparatus of claim 1, wherein the second airflow comprises a system airflow across the interior of an enclosure of an electronic system.

7. An electronic system, comprising:
   an enclosure containing at least one electronic device, the enclosure defining an interior;
   at least one fan mounted to the enclosure, the at least one fan generating a first airflow across the interior of the enclosure;
   a heat sink in thermal communication with the at least one electronic device; and
   at least one angled flow control vane at an end of the heat sink to divert a second airflow exiting the end such that the second airflow blends with the first airflow, the second airflow, prior to its diversion, being substantially orthogonal to the first airflow, the end being near a wall of the enclosure.

8. The electronic system of claim 7, wherein the heat sink comprises:
   a heat spreader surface in thermal communication with the at least one electronic device; and
   a set of substantially parallel plates extending from and in thermal communication with the heat spreader surface.

9. The electronic system of claim 8, wherein each of the at least one angled flow control vanes is integral with one of the substantially parallel plates.

10. The electronic system of claim 8, wherein the set of substantially parallel plates is open in a center section along its edges opposite the heat spreader surface and closed in each of two end sections along its edges opposite the heat spreader surface and the electronic system further comprises:
    a fan mounted across the center section to direct air into the center section, thereby generating the second airflow.

11. The electronic system of claim 7, wherein the at least one electronic device comprises an integrated circuit.

12. The electronic system of claim 7, wherein the electronic system comprises a server.

13. A method for cooling an electronic device, comprising:

placing a heat sink in thermal communication with the electronic device;

generating a first airflow that enters the heat sink from outside the heat sink and exits the heat sink at an end of the heat sink, the end being near an airflow obstruction; and angularly diverting the first airflow at the end such that the first airflow blends with a second airflow, the first airflow being, prior to its diversion, substantially orthogonal to the second airflow.

14. The method of claim 13, wherein angularly diverting the first airflow comprises providing at least one angled flow control vane at the end of the heat sink.

15. The method of claim 13, wherein generating the first airflow comprises using a fan mounted across the heat skink to direct air into the heat sink.

16. The method of claim 13, wherein the second airflow comprises a system airflow across the interior of an enclosure of an electronic system.

17. An apparatus for cooling an electronic device, comprising:

means, in thermal communication with the electronic device, for dissipating heat from the electronic device;

means for generating a first airflow that enters the means for dissipating heat from the electronic device from outside the means for dissipating heat from the electronic device and exits the means for dissipating heat from the electronic device at an end thereof; and means for angularly diverting the first airflow at the end such that the first airflow blends with a second airflow that is substantially orthogonal to the first airflow prior to its diversion, the end being near an airflow obstruction.

18. The apparatus of claim 17, wherein the means for dissipating heat from the electronic device comprises a heat sink having a plurality of substantially parallel plates.

19. The apparatus of claim 17, wherein the means for generating the first airflow comprises a fan mounted across the means for dissipating heat from the electronic device to direct air into the means for dissipating heat from the electronic device.

20. The apparatus of claim 17, wherein the means for angularly diverting the first airflow comprises at least one angled flow control vane.

\* \* \* \* \*